United States Patent
Owanesian et al.

[11] Patent Number: 5,850,333
[45] Date of Patent: Dec. 15, 1998

[54] ENCLOSURE FOR MACHINE CONTROL PANEL

[75] Inventors: Harry A. Owanesian; Paul A. Kirkpatrick, both of Charlotte, N.C.

[73] Assignee: Ingersoll-Rand Company, Woodcliff Lake, N.J.

[21] Appl. No.: 820,824

[22] Filed: Mar. 19, 1997

[51] Int. Cl.⁶ .................................................... H05K 7/20
[52] U.S. Cl. ......................... 361/704; 361/688; 361/690; 361/697; 361/703; 361/707; 361/715; 165/80.2; 165/80.3; 165/185; 257/712; 257/718
[58] Field of Search ................................. 361/688, 689, 361/690, 704, 707, 715, 703, 697; 165/80.3, 185, 80.2; 257/718, 719

[56] References Cited

U.S. PATENT DOCUMENTS

| | | | |
|---|---|---|---|
| 4,500,944 | 2/1985 | Roberts et al. | 361/690 |
| 5,166,862 | 11/1992 | Durivage, III et al. | 361/690 |
| 5,585,349 | 12/1996 | Kelly et al. | 361/715 |

OTHER PUBLICATIONS

Rotary Screw Air Compressors SSR 10–40 HP Brochure © 1989 Ingersoll–Rand Co.
Rotary Screw Air Compressors, SSR® 50–200HP Brochure ©1990 Ingersoll–Rand Co.
LLE Reciprocationg Air comprressor Brochure, © 1994 Ingersoll–Rand Co.
Intellisys® System Controller Brochure, ©1993 Ingersoll–Rand Company.

*Primary Examiner*—Leo P. Picard
*Assistant Examiner*—Boris L. Chervinsky
*Attorney, Agent, or Firm*—Michael M. Gnibus

[57] ABSTRACT

An enclosure for a machine control panel assembly including an enclosure body having an outer periphery, a first enclosure side, and a second enclosure side; a heat sink formed along the second enclosure side; and a cover plate having at least two edges, wherein the cover plate is located between the heat sink and the outer periphery. The cover plate also including lips along the at least two edges to direct moisture away from the enclosure body.

17 Claims, 7 Drawing Sheets

ENCLOSURE FOR MACHINE CONTROL PANEL

BACKGROUND OF THE INVENTION

The invention relates to an enclosure for a machine control panel and more particularly to a machine control panel enclosure that includes a heat sink and a cover plate having a pair of lateral edges with moisture deflecting lips along the lateral edges.

For a number of years machine operators have been able to set and adjust machine operating parameters electronically on a variety of machines including air compressors. In conventional machines, machine control parameters are set and adjusted using an externally mounted control panel that includes a microprocessor based controller connected to a membrane switch or other suitable input means. The microprocessor based controller processes the machine operating parameters inputted by the machine operator via the input means and, as required, effects the operation of the machine.

Ambient machine operating conditions can negatively affect the reliability of the known electronic controls if the controls are not properly enclosed and protected by the control panel. Frequently, the moisture seal formed between the control panel and the machine housing is not sufficient to prevent moisture from leaking past the control panel. Such moisture can short the electronic components and corrode or otherwise degrade electrical connections. Even if a seal sufficient to prevent leakage is formed between the control panel and machine, conventional control panels are typically made from plastic and are thus susceptible to shrinkage and warping due to varying ambient temperatures and high machine operating temperatures, and such shrinkage and warping results in leaks.

Existing control panels do not provide a means for shielding the electrical control components from electromagnetic interference, (EMI); radio frequency interference, (RFI); and electrical static discharge (ESD) which can degrade the signals transmitted through the controller.

Additionally, existing electronic controls are difficult to access when it is necessary to repair or otherwise service the controls, and known control panels are difficult to assemble.

The foregoing illustrates limitations known to exist in present devices and methods. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing an enclosure for a machine control panel including an enclosure body having an outer periphery, a first enclosure side, and a second enclosure side; a heat sink formed along the second enclosure side near the outer periphery; and a cover plate having at least two edges, wherein the cover plate is located between the heat sink and the first outer periphery portion. The cover plate also including lips along the at least two edges to direct moisture away from the enclosure body.

The foregoing and other aspects will become apparent from the following detailed description of the invention when considered in conjunction with the accompanying drawing figures.

DESCRIPTION OF THE DRAWING FIGURES

DESCRIPTION OF THE PREFERRED EMBODIMENT

Figure 1:
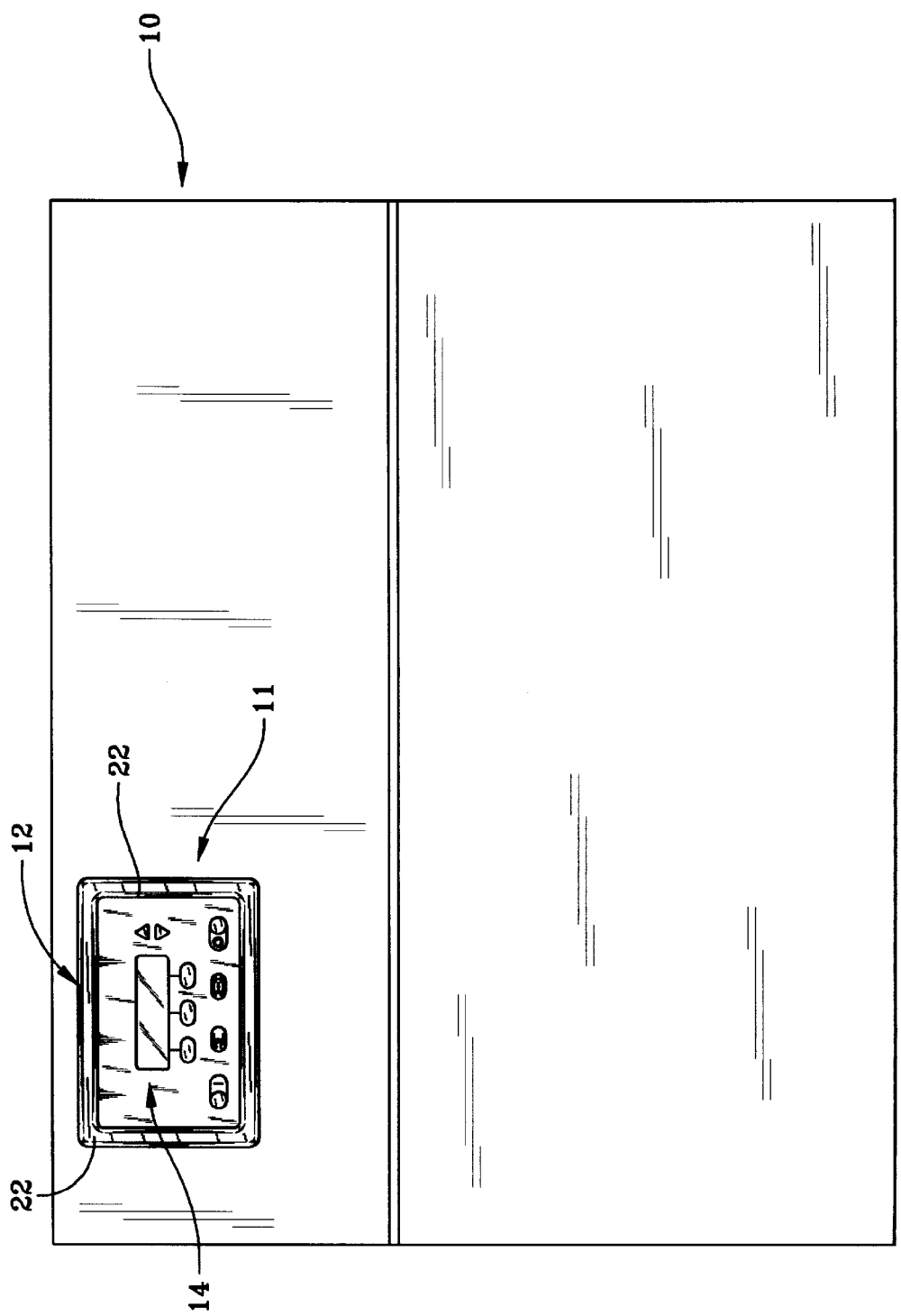
FIG. 1 is a front elevational view of a machine having a control panel that includes the enclosure of the present invention.

Turning now to the drawings wherein like parts are referred to by the same number throughout the several views, FIG. 1 generally shows a machine 10 that includes a machine control panel 11 which permits a machine operator to easily control and monitor machine operating parameters.

Figure 2:
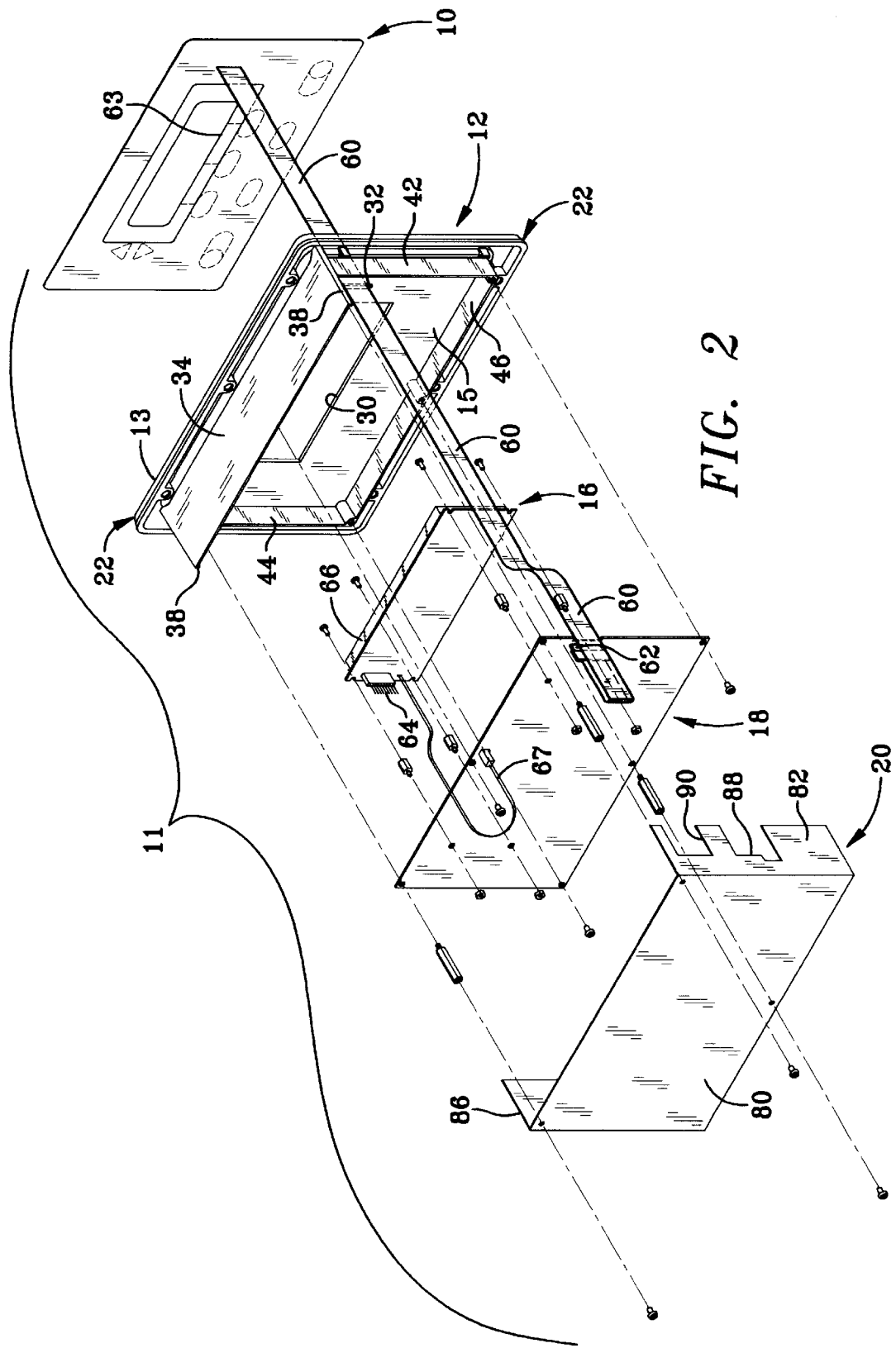
FIG. 2 is an exploded assembly view of the machine control panel of FIG. 1.

The machine control panel 11, as shown in FIG. 2, includes an enclosure 12 having a first enclosure side 13 and a second enclosure side 15; membrane switch 14 seated on the first enclosure side 13; and display module 16, circuit board 18 and back cover 20 which are supported on the second enclosure side 15. The display panel 16, circuit board 18, membrane switch 14 and back cover 20 will be described in further detail hereinafter.

The machine control panel assembly 11 may be used to control the operation of an air compressor or any other machine 10 which requires precise control of machine operating parameters.

The enclosure 12 of the present invention will now be described. The enclosure 12 is unitary and it is preferred that the enclosure be made from an aluminum alloy by a die casting process. The aluminum alloy construction allows for better thermal stability of the enclosure during operation of the machine 10 than current control panel enclosure designs. As a result, shrinkage and warpage of the enclosure 12, produced by variations in ambient and machine operating temperatures, is minimized.

Figure 3:
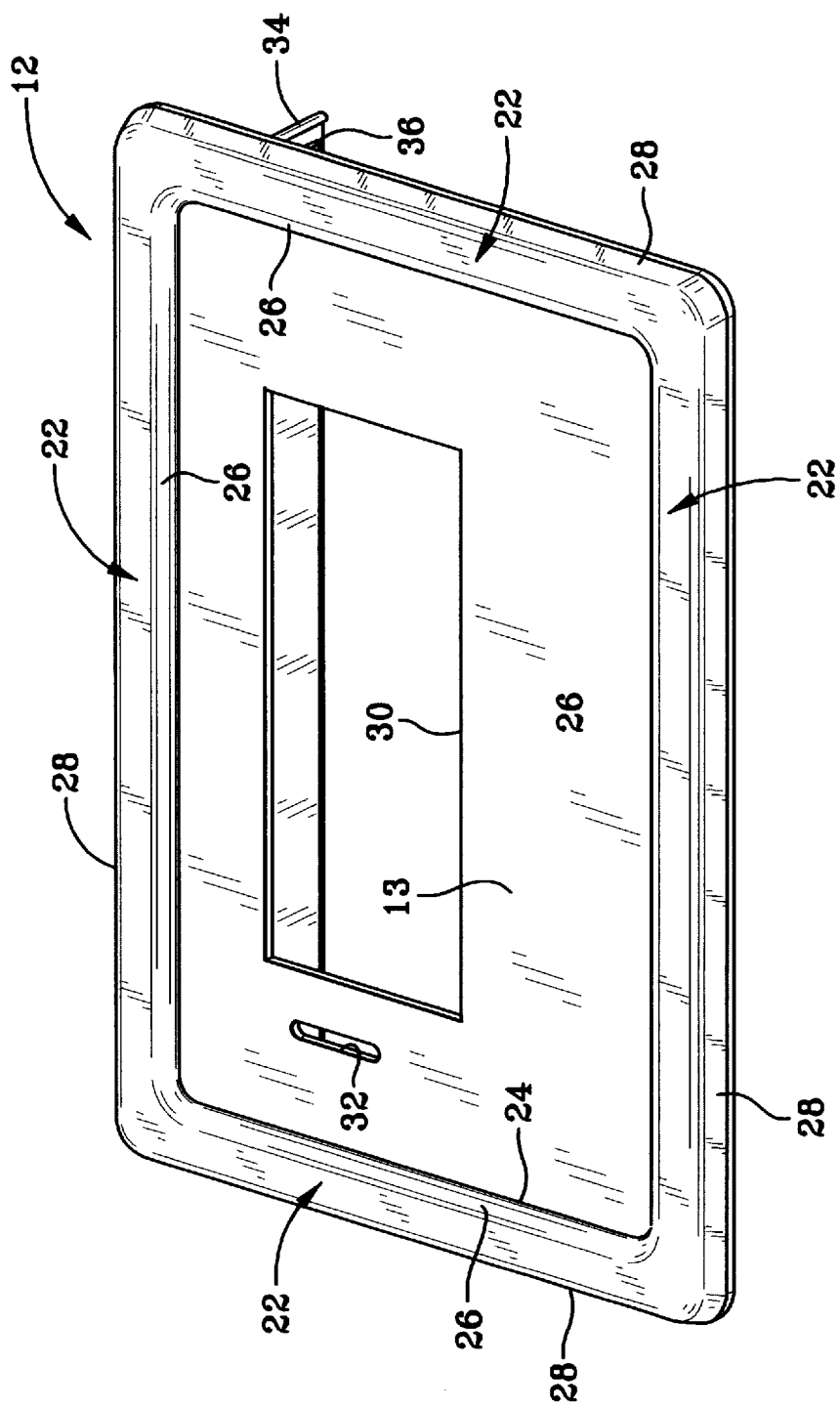
FIG. 3 is a front isometric view of the enclosure of FIG. 2.
Figure 4:
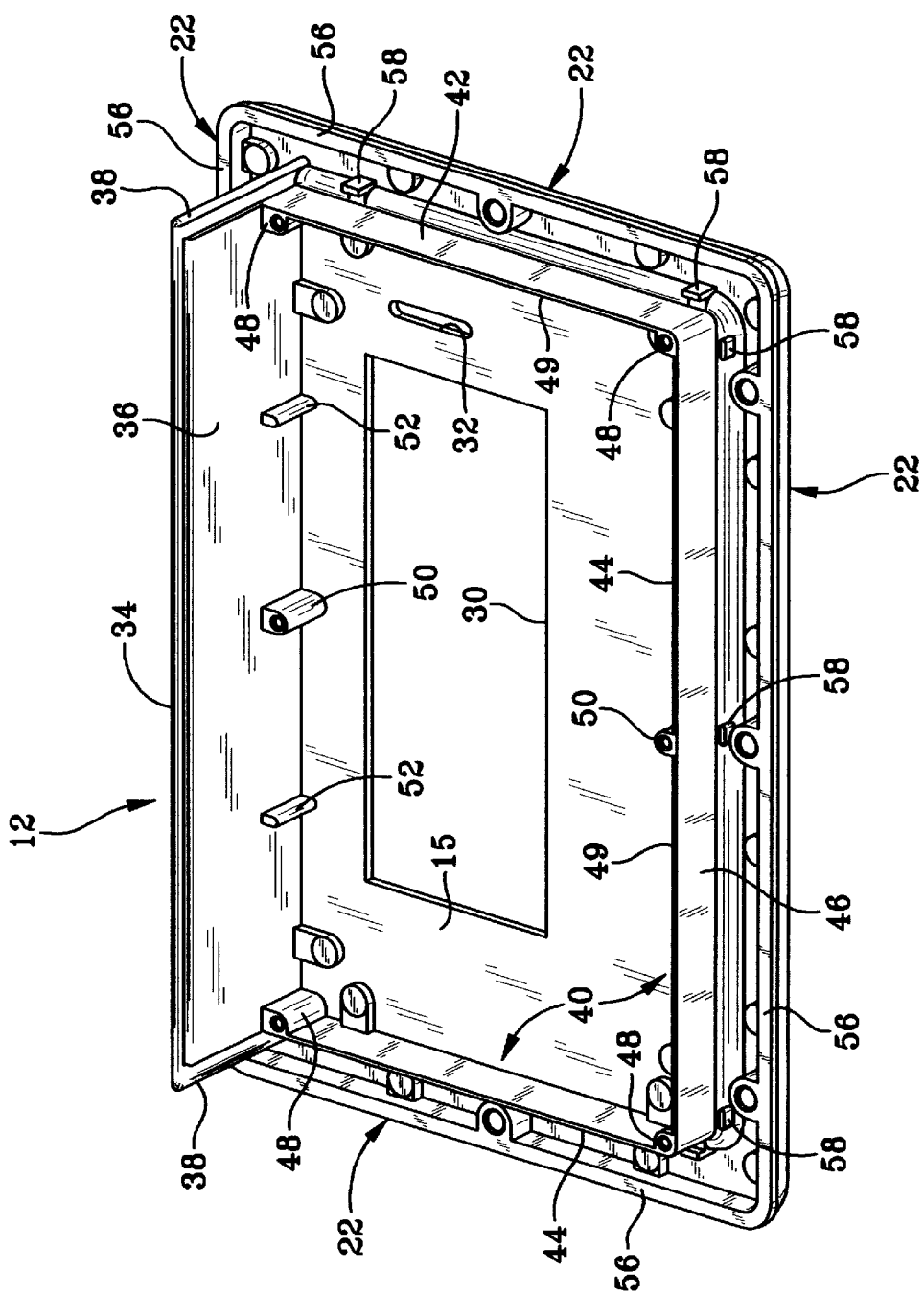
FIG. 4 is a rear isometric view of the enclosure of FIG. 2.
Figure 5:
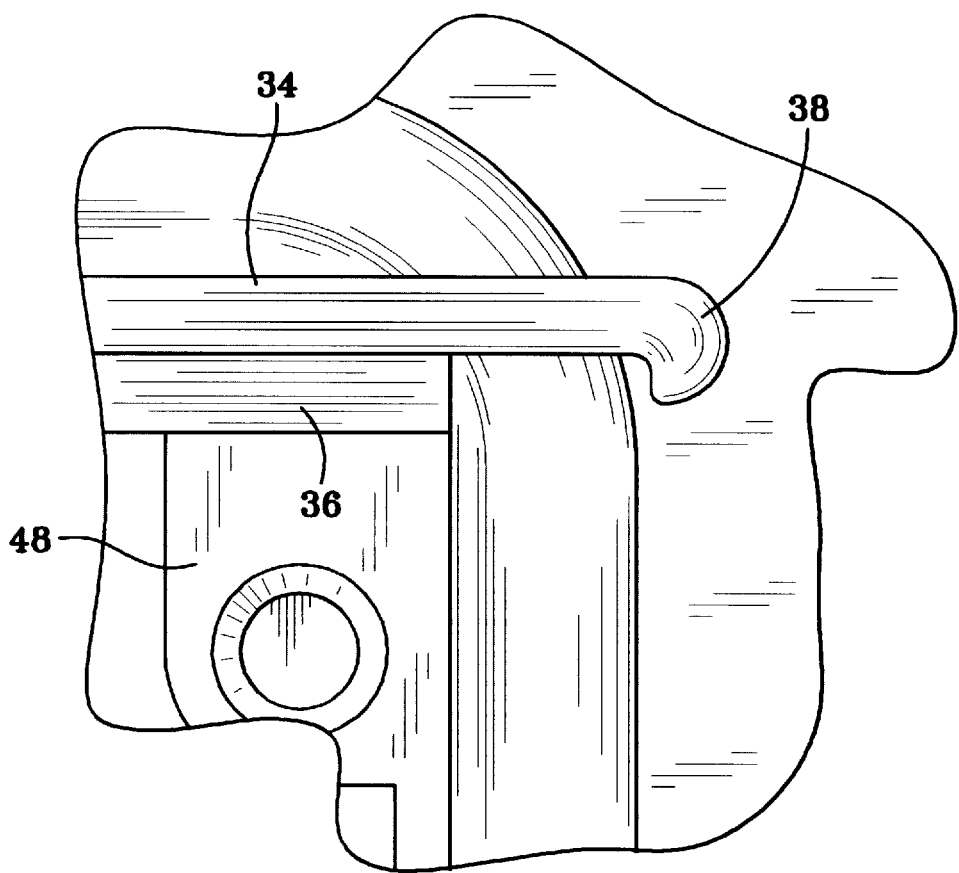
FIG. 5 is an enlarged rear elevational view of the enclosure of FIG. 4 showing the cover plate lip in detail.

Turning now to FIGS. 3–5 which show enclosure 12 in detail, an endless outer periphery 22 defines a recess 24 along the first enclosure side 13. Bezels 26 and 28 are provided along the inner and outer edges of the outer periphery 22. See FIG. 3. Window 30 and cable slot 32 extend completely through the enclosure side 13. As shown in FIGS. 2 and 3, the window is rectangular and the slot is located proximate one of the lateral window sides. It should be understood that the window may be any suitable shape and the slot may be located at any suitable location along the enclosure.

Now turning to the second enclosure side 15, side-by-side elongate cover plate 34 and heat sink 36 are located along second enclosure side 15. The cover plate and heat sink are made integral with the second enclosure side along a longitudinal edge and extend away from the second enclosure side and terminate at a free longitudinal edge. The cover plate is made integral with the heat sink and is located between the outer periphery 22 and the heat sink 36.

Cover plate 34 has a pair of lateral edges which extend beyond the lateral edges of the heat sink. A lip 38 is formed along each lateral cover plate edge. The lips 38 are for directing moisture or particulate matter which may leak past the enclosure, outward away from the enclosure 12. In this way, control panel electrical components such as circuit board 18 and display module 16 will not be damaged or otherwise adversely affected by the undesirable moisture or particulate matter. The lips 38 extend completely along the cover plate lateral edges and each lip 38 has the tear drop shape shown in the enlarged view of FIG. 5.

A U-shaped circuit board support shield 40 is made integral with the second enclosure side 15 and is comprised of first and second lateral walls 42 and 44 which are joined along a lateral edge by longitudinal wall 46. As shown in FIG. 4, the opposite lateral edges of the lateral walls 42 and 44 are made integral with the heat sink 36. In this way, the walls 42, 44, and 46, enclosure second side 15 and heat sink 36 define a shielded chamber 49.

Circuit board fastening pillars 48 are provided in chamber 49 at the corners defined by walls 42 and 46, walls 44 and 46, and at the corners defined by heat sink 36 and walls 42 and 44. See FIG. 4. Additional circuit board pillars 50, similar to pillars 48, are provided in chamber 49 at approximately the middle of the heat sink 36 and the longitudinal wall 46.

The circuit board 18 is joined to the pillars 48 and 50 by conventional self-tapping fasteners or the like.

Two additional circuit board support pillars 52 are located in chamber 49 adjacent heat sink 36 between pillars 48 and 50. The circuit board 18 is not fastened to the pillars 52. The pillars 48, 50, and 52; and the free longitudinal edges of walls, 42, 44, and 46 support the circuit board 18 seated on the enclosure 12 in the manner shown in FIG. 6. Components electrically connected to the circuit board are located in the shield chamber 49 and in this way are shielded from undesirable RFI, EMI, and ESD.

As shown in FIG. 4, the portion of the outer bezel 28 located adjacent the second enclosure side defines a continuous seat 56 adapted to support a gasket or other suitable sealing member. When the control panel assembly is mounted on the machine 10 as shown in FIG. 1, the gasket (not shown) is compressed between the machine housing and the enclosure seat to form a seal around the perimeter of the enclosure and prevent moisture from leaking past the control panel.

Tangs 58 located along the enclosure second side 15, adjacent walls 42, 44, and 46 provide for proper alignment of the cover 20 when the control panel assembled.

The membrane switch 14, display module 16, circuit board 18, and cover 20 will now be described. Membrane switch 14 is adapted to be seated in recess 24. The inner bezel 26 guides the switch 14 into the recess. When the membrane switch is seated in the recess 24, the outer periphery 22 protects the perimeter edge of the membrane switch from damage.

The membrane switch is of conventional design well known to one skilled in the art and includes a four-by-four matrix that is electrically connected to a flexible ribbon cable 60. The ribbon cable 60 is inserted through slot 32 when the membrane switch is seated in the recess 24 and a conventional plug or connector 62 at the free end of the ribbon cable is connected to the circuit board 18. See FIG. 2. A membrane switch window 63 overlies enclosure window 30 when the switch 14 is assembled with enclosure 12.

Display module 16 provides readable machine instructions and operating parameters to a machine operator via display panel 66 which is located in window 30 when machine control panel 11 is assembled. The display panel 66 is a well known liquid crystal display (LCD) panel. The display module 16 has a 20 pin connector plug 64 that is adapted to be plugged or otherwise electrically connected to a mating receptacle along circuit board 18. A back light (not shown) for panel 66 is energized through a back light connector 67 that is also connected to a power source along the circuit board. The back light allows the panel 66 to be visible in dark or dimly lit work environments.

Figure 6:
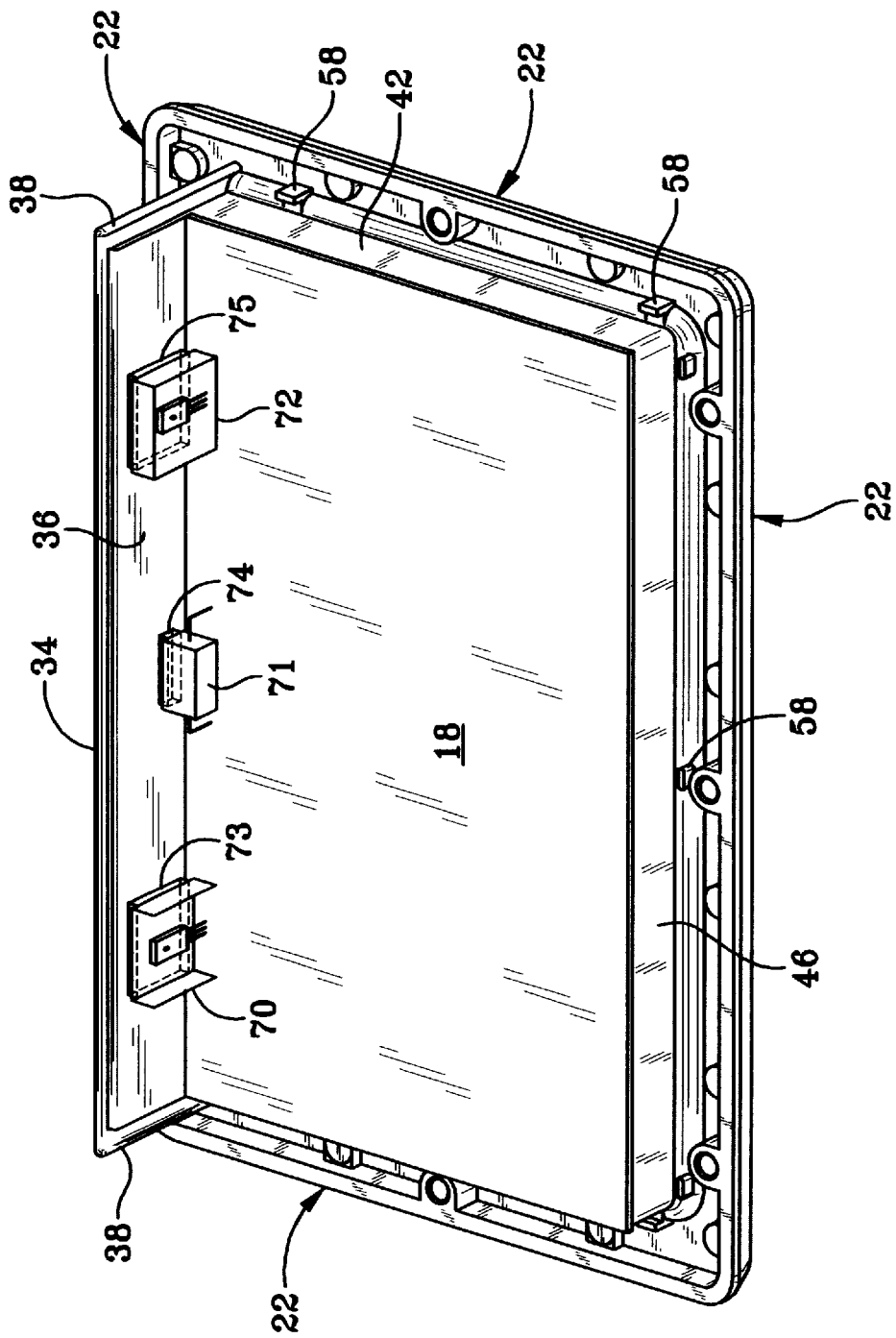
FIG. 6 is a rear isometric view of the enclosure, like FIG. 4, showing a circuit board seated on the enclosure.

Circuit board 18 is of conventional design. As described hereinabove, the circuit board is seated on the walls 42, 44, and 46; and pillars 48, 50, and 52, and is fastened to pillars 48 and 50. Turning now to FIG. 6, electrical components generally referred to as 70, 71, and 72 are soldered or otherwise connected to the circuit board so that when the circuit board is fastened onto the enclosure, the components 70, 71, and 72 are located closely adjacent heat sink 36. Thermal pads 73, 74, and 75 are located between the electrical component and the heat sink 36. Heat is supplied to the thermal pads and the electrical components are thermally bonded to the heat sink. As a result, a continuous path from the components to the heat sink is formed so that heat generated by the components is dissipated, from the components along the path to the heat sink and will be absorbed by the enclosure. In this way, the operating temperatures of the components will be reduced.

Cover 20 includes back panel 80, and side panels 82, 84, and 86. When the cover is assembled with the enclosure, the free longitudinal edges of the side panels are located between the tangs 58 and the respective wall of shield 40. For example, side panel 82 is located between the tangs 58 and wall 42, panel 84 is located between wall 46 and tangs 58, and panel 86 is located between tangs 58 and wall 44. In this way, the cover is aligned with the enclosure when the cover and enclosure are assembled.

Figure 7:
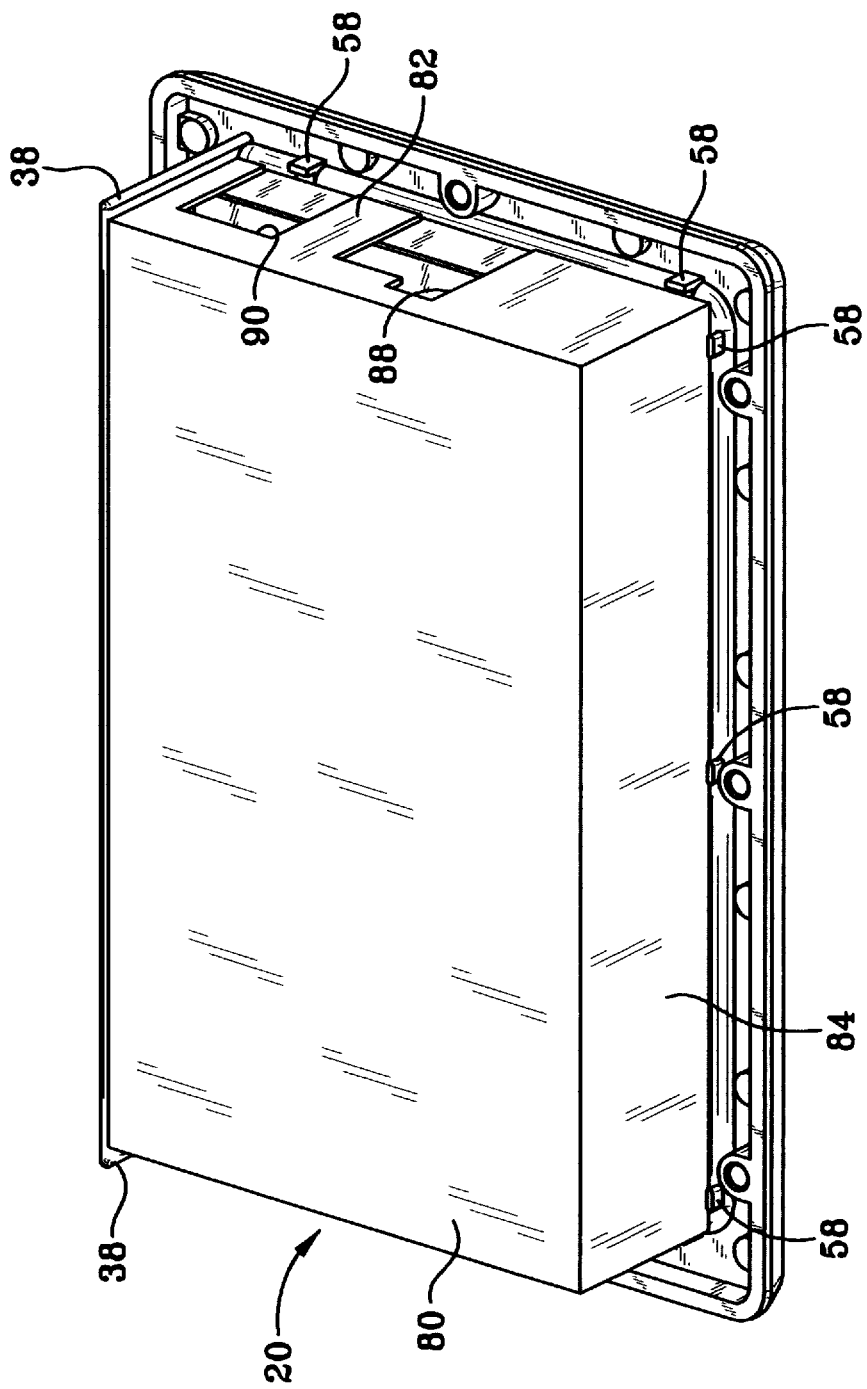
FIG. 7 is a rear isometric view of the assembled machine control panel of FIG. 2.

Additionally, as shown in FIG. 7, when the cover is located on the enclosure, the free edge of panel 80 and the lateral free edges of the panels 82 and 86 are in abutment with the cover plate 34. The cover fully encloses the circuit board 18 and display module 16. The edges of side panels 86 and 82 are located in the space between the edges of the heat sink and cover plate so that the lips 38 extend beyond the cover 20 and direct moisture away from the enclosure.

Access openings 88 and 90 are provided along side panel 82 and allow an operator to access the circuit board connectors without removing cover 20, and easily repair the control panel. Additionally, access openings similar to openings 88 and 90 may be provided along sides 84 and 86.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

Having described the invention, what is claimed is:

1. An enclosure for a machine control panel, the enclosure comprising:

A) an enclosure body having an outer periphery portion, a first enclosure side, and a second enclosure side;

B) a heat sink formed along the second enclosure side; and

C) a fixed cover plate having at least two edges, the at least two edges being joined by a free edge, wherein the cover plate is formed along the second enclosure side between the heat sink and the outer periphery portion, said cover plate having lip means along the at least two edges, said lip means for directing moisture away from the enclosure body, said free edge being located away from the second enclosure side.

2. The enclosure as claimed in claim 1 wherein the enclosure is unitary.

3. The enclosure as claimed in claim 1 wherein the heat sink extends longitudinally along the second enclosure side the enclosure body having a window and a slot.

4. The enclosure as claimed in claim 1 wherein the lip means for directing fluid away from the enclosure is comprised of edges each having a tear drop shape.

5. The enclosure as claimed in claim 1, the enclosure further comprising a support shield attached to the second enclosure side, the support shield comprising: a first wall, a second wall, a third wall joining the first and second walls, the first and second walls each having an edge made integral with the heat sink, the first, second, and third walls, heat sink and second enclosure side defining a shield chamber.

6. The enclosure as claimed in claim 5, the enclosure further comprising at least one support pillar located between the first and second walls adjacent the heat sink.

7. The enclosure as claimed in claim 1 wherein the heat sink is made integral with the cover plate.

8. The enclosure as claimed in claim 6 wherein the at least one support pillar is made integral with the heat sink.

9. The enclosure as claimed in claim 1 wherein the outer periphery defines a recess, said outer periphery having a first edge and a second edge and a bezel along the first and second edges.

10. The enclosure as claimed in claim 5, the enclosure further comprising tangs adjacent the first, second, and third walls.

11. The enclosure as claimed in claim 1 wherein the cover plate is substantially perpendicular to the enclosure body.

12. The enclosure as claimed in claim 1 wherein the heat sink is substantially perpendicular to the enclosure body.

13. A machine control panel assembly comprising;
   A) An enclosure for a machine control panel, the enclosure comprising: an enclosure body having a window and an outer periphery which defines a recess, a first enclosure side, and a second enclosure side; a heat sink along the second enclosure side; and a cover plate having at least two cover plate edges, wherein the cover plate is located between the heat sink and the outer periphery, said cover plate having means for directing fluid away from the enclosure, said means being provided along the at least two edges, the enclosure further comprising a support shield comprising a first wall, a second wall, and a third wall joining the first and second walls, the first and second walls having an edge made integral with the heat sink; and alignment tang members adjacent said walls;
   B) display means located in said enclosure window;
   C) a membrane switch located in the recess, said membrane switch having a membrane window which overlies said display means when the membrane switch is located in said recess;
   D) a circuit board supported by the first, second, and third walls of the support shield, said circuit board being electrically connected to the display means and membrane switch; and
   E) a back cover which encloses the circuit board and display means.

14. The machine control panel assembly as claimed in claim 13 wherein the display means is a LCD display.

15. The machine control panel assembly as claimed in claim 13 wherein the circuit board includes at least one component that is thermally bonded to the heat sink.

16. The machine control panel as claimed in claim 13 wherein the back cover has a first cover side located between the first wall and the tangs adjacent thereto, a second cover side located between the second wall and tangs adjacent thereto, and a third cover side located between the third wall and the tangs.

17. The machine control panel as claimed in claim 11 wherein the cover plate is substantially perpendicular to the enclosure body.

* * * * *